(12) United States Patent
Kamata et al.

(10) Patent No.: US 11,764,546 B2
(45) Date of Patent: Sep. 19, 2023

(54) SEMICONDUCTOR LASER DEVICE

(71) Applicants: DENSO CORPORATION, Kariya (JP); TOYOTA JIDOSHA KABUSHIKI KAISHA, Toyota (JP); MIRISE Technologies Corporation, Nisshin (JP); QD LASER, Inc., Kawasaki (JP)

(72) Inventors: Yuki Kamata, Nisshin (JP); Hiroyuki Tarumi, Nisshin (JP); Koichi Oyama, Nisshin (JP); Keizo Takemasa, Kawasaki (JP); Kenichi Nishi, Kawasaki (JP); Yutaka Onishi, Kawasaki (JP)

(73) Assignees: DENSO CORPORATION, Kariya (JP); TOYOTA JIDOSHA KABUSHIKI KAISHA, Toyota (JP); MIRISE Technologies Corporation, Nisshin (JP); QD LASER, Inc., Kawasaki (JP)

( * ) Notice: Subject to any disclaimer, the term of this patent is extended or adjusted under 35 U.S.C. 154(b) by 104 days.

(21) Appl. No.: 17/501,497

(22) Filed: Oct. 14, 2021

(65) Prior Publication Data
US 2022/0158415 A1    May 19, 2022

(30) Foreign Application Priority Data
Nov. 13, 2020 (JP) .................... 2020-189721

(51) Int. Cl.
*H01S 5/34* (2006.01)
*H01S 5/10* (2021.01)
(Continued)

(52) U.S. Cl.
CPC .......... *H01S 5/341* (2013.01); *H01S 3/08036* (2013.01); *H01S 5/04256* (2019.08);
(Continued)

(58) Field of Classification Search
CPC .......... H01S 5/341–3412; H01S 5/141; H01S 3/08036; H01S 5/3054–3063; H01S 5/3086–309; H01S 5/1096
See application file for complete search history.

(56) References Cited

U.S. PATENT DOCUMENTS 6,177,684 B1 *  1/2001  Sugiyama ............... H01L 33/06
                                                    257/17
6,573,527 B1 *  6/2003  Sugiyama .............. B82Y 10/00
                                                    257/17
(Continued)

FOREIGN PATENT DOCUMENTS

GB        2409334 A  *  6/2005  ............. B82Y 20/00
JP    2004528705 A  *  9/2004
(Continued)

OTHER PUBLICATIONS

Tanaka, "Low Power Consumption by Quantum Dot Laser Technology", 2010: pp. 489-494.

*Primary Examiner* — Joshua King
(74) *Attorney, Agent, or Firm* — POSZ LAW GROUP, PLC

(57) ABSTRACT

The semiconductor laser device includes: an activation layer having at least one first quantum dot layer and at least one second quantum dot layer having a longer emission wavelength than the first quantum dot layer. The gain spectrum of the active layer has the maximum values at the first wavelength and the second wavelength longer than the first wavelength corresponding to the emission wavelength of the first quantum dot layer and the emission wavelength of the second quantum dot layer, respectively. The maximum value of the gain spectrum at the first wavelength is defined as the first maximum value, and the maximum value of the gain
(Continued)

spectrum at the second wavelength is defined as the second maximum value. The first maximum value is larger than the second maximum value.

11 Claims, 9 Drawing Sheets

(51) Int. Cl.
    *H01S 5/042*     (2006.01)
    *H01S 5/14*     (2006.01)
    *H01S 3/08036*     (2023.01)
    *H01S 5/30*     (2006.01)

(52) U.S. Cl.
    CPC ............ *H01S 5/1096* (2013.01); *H01S 5/141* (2013.01); *H01S 5/3412* (2013.01); *H01S 5/3054* (2013.01); *H01S 5/3086* (2013.01)

(56) References Cited

U.S. PATENT DOCUMENTS

| | | | |
|---|---|---|---|
| 6,600,169 B2* | 7/2003 | Stintz | B82Y 10/00 257/17 |
| 6,794,265 B2* | 9/2004 | Lee | H01L 29/127 252/301.6 F |
| 6,816,525 B2* | 11/2004 | Stintz | B82Y 10/00 372/45.01 |
| 6,870,178 B2* | 3/2005 | Asryan | B82Y 20/00 257/97 |
| 7,558,301 B2* | 7/2009 | Lin | B82Y 20/00 372/43.01 |
| 7,795,609 B2* | 9/2010 | Huffaker | B82Y 20/00 257/17 |
| 9,362,719 B2* | 6/2016 | Bhattacharya | H01S 5/3013 |
| 2002/0079485 A1* | 6/2002 | Stintz | B82Y 10/00 257/14 |
| 2002/0114367 A1* | 8/2002 | Stintz | B82Y 10/00 372/45.01 |
| 2003/0066997 A1* | 4/2003 | Akiyama | B82Y 20/00 257/9 |
| 2003/0142944 A1* | 7/2003 | Sundar | H01S 5/10 252/62.3 BT |
| 2004/0009681 A1* | 1/2004 | Fafard | H01S 5/141 372/39 |
| 2004/0099858 A1* | 5/2004 | Lee | B82Y 20/00 257/13 |
| 2004/0131097 A1* | 7/2004 | Deppe | B82Y 20/00 372/45.01 |
| 2004/0169173 A1 | 9/2004 | Saito | |
| 2004/0196543 A1* | 10/2004 | Akiyama | B82Y 20/00 359/344 |
| 2005/0045868 A1* | 3/2005 | Otsubo | H01S 5/2231 257/14 |
| 2005/0169332 A1* | 8/2005 | Schwarz | H01S 5/341 372/39 |
| 2005/0279989 A1* | 12/2005 | Li | H01S 5/2231 257/E33.054 |
| 2006/0222028 A1* | 10/2006 | Hatori | H01S 5/341 |
| 2006/0227825 A1* | 10/2006 | Kovsh | B82Y 10/00 372/30 |
| 2007/0091419 A1* | 4/2007 | Akiyama | B82Y 20/00 359/344 |
| 2007/0189348 A1* | 8/2007 | Kovsh | H01S 5/341 372/45.01 |
| 2007/0201522 A1* | 8/2007 | Huffaker | B82Y 20/00 372/39 |
| 2007/0215857 A1 | 9/2007 | Saito | |
| 2008/0157059 A1* | 7/2008 | Hatori | B82Y 20/00 257/E21.04 |
| 2008/0308788 A1 | 12/2008 | Ebe et al. | |
| 2008/0310470 A1* | 12/2008 | Ooi | H01S 5/341 438/46 |
| 2009/0321781 A1* | 12/2009 | Broadley | H01L 33/32 977/762 |
| 2011/0181945 A1* | 7/2011 | Nishi | H01S 5/341 977/932 |
| 2014/0104678 A1* | 4/2014 | Rafailov | H01S 3/0092 359/328 |
| 2014/0314370 A1 | 10/2014 | Hatori et al. | |
| 2016/0087153 A1* | 3/2016 | Terashima | H01L 33/12 372/49.01 |
| 2016/0336480 A1* | 11/2016 | Nishi | H01L 33/08 |
| 2018/0337514 A1* | 11/2018 | Tang | H01S 5/34333 |
| 2021/0373350 A1* | 12/2021 | Oda | H01S 5/3412 |

FOREIGN PATENT DOCUMENTS

| | | | | |
|---|---|---|---|---|
| JP | 2004288759 A | * | 10/2004 | ............ B82Y 20/00 |
| JP | 2007318165 A | * | 12/2007 | ............ B82Y 10/00 |
| JP | 2009117856 A | * | 5/2009 | ............ B82Y 10/00 |
| JP | 2010087325 A | * | 4/2010 | ............ B82Y 20/00 |
| JP | 2011-3803 A | | 1/2011 | |
| WO | WO-2009019507 A1 | * | 2/2009 | ............ B82Y 20/00 |
| WO | WO-2014076444 A1 | * | 5/2014 | ............ B82Y 20/00 |

* cited by examiner

SEMICONDUCTOR LASER DEVICE

CROSS REFERENCE TO RELATED APPLICATION

The present application claims the benefit of priority from Japanese Patent Application No. 2020-189721 filed on Nov. 13, 2020. The entire disclosure of the above application is incorporated herein by reference.

TECHNICAL FIELD

The present disclosure relates to a semiconductor laser device including a quantum dot layer.

BACKGROUND

In a semiconductor laser device using an SOA (semiconductor optical amplifier), a method of obtaining high output power in a wide temperature range by three-dimensional confinement of electrons by a quantum dot layer and doping of p-type impurities in the vicinity of the active layer has been proposed.

SUMMARY

According to an example, the semiconductor laser device may include: an activation layer having at least one first quantum dot layer and at least one second quantum dot layer having a longer emission wavelength than the first quantum dot layer. The gain spectrum of the active layer has the maximum values at the first wavelength and the second wavelength longer than the first wavelength corresponding to the emission wavelength of the first quantum dot layer and the emission wavelength of the second quantum dot layer, respectively. The maximum value of the gain spectrum at the first wavelength is defined as the first maximum value, and the maximum value of the gain spectrum at the second wavelength is defined as the second maximum value. The first maximum value is larger than the second maximum value.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
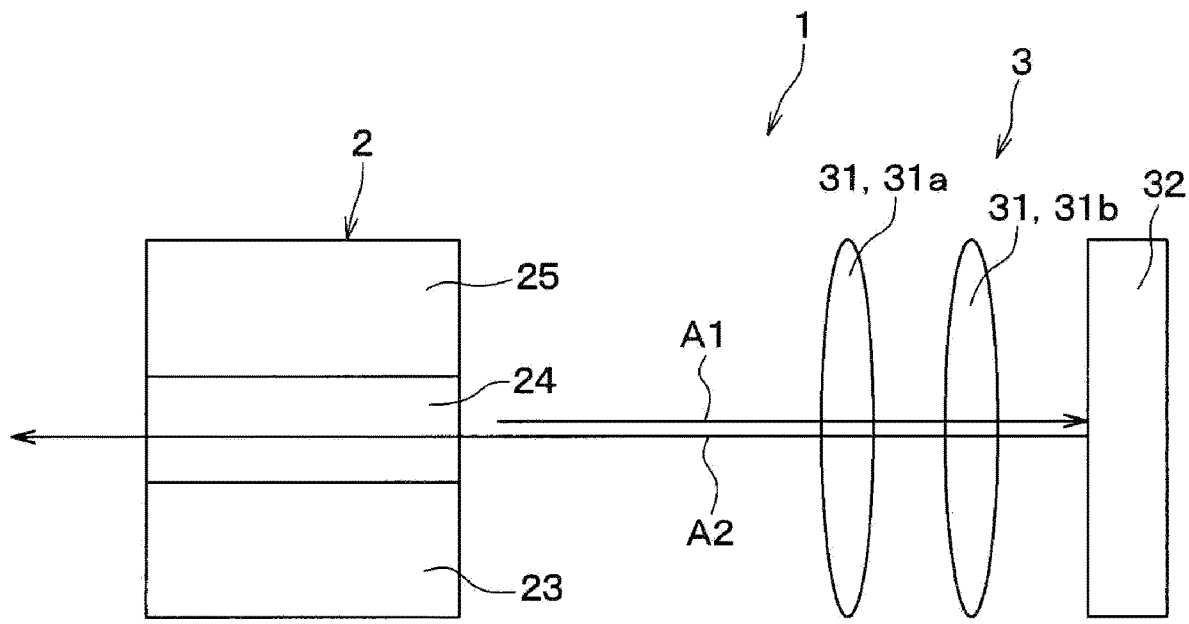
FIG. 1 is a diagram showing a configuration of a semiconductor laser device according to a first embodiment.

Such a semiconductor laser device as a conceivable technique usually has a characteristic that the gain peaks at one wavelength. When the environmental temperature changes, the gain peak does not change significantly, but the wavelength at which the gain peaks changes significantly. Therefore, when the operating wavelength is fixed, the fluctuation of the output due to the temperature change becomes large.

Regarding this, a gain characteristic having a flat peak is obtained by using a plurality of quantum dot layers having different emission wavelengths. The wavelength band that takes the peak corresponds to the wavelength shift amount in the operating temperature range, thereby reducing the gain fluctuation due to the temperature change.

However, if the density of states of the quantum dots is not completely discrete, the gain peak fluctuates depending on the temperature, and therefore, when the operating wavelength is fixed, the output fluctuates greatly. Moreover, it may be difficult to completely discretize the density of states of quantum dots. Therefore, even when the gain peak fluctuates depending on the temperature, there is a need for a method for reducing the gain fluctuation at the operating wavelength.

In view of the above points, a semiconductor laser is provided to be capable of reducing gain fluctuation due to temperature change.

In order to achieve the above object, the semiconductor laser device includes: an activation layer having at least one first quantum dot layer and at least one second quantum dot layer having a longer emission wavelength than the first quantum dot layer. The gain spectrum of the active layer has the maximum values at the first wavelength and the second wavelength longer than the first wavelength corresponding to the emission wavelength of the first quantum dot layer and the emission wavelength of the second quantum dot layer. The maximum value of the gain spectrum at the first wavelength is defined as the first maximum value, and the maximum value of the gain spectrum at the second wavelength is defined as the second maximum value. The first maximum value is larger than the second maximum value.

As described above, when the first maximum value on the short wavelength side is made larger than the second maximum value on the long wavelength side, the variation in gain due to temperature change becomes small in a certain wavelength band. Therefore, the gain fluctuation due to the temperature change can be reduced.

The feature may be a semiconductor laser device including a light source for generating laser light. The light source includes the active layer having at least one first quantum dot layer with a first quantum dot and at least one second quantum dot layer with a second quantum dot. The dimensions of the second quantum dot are larger than the dimensions of the first quantum dot. The number of layers of the first quantum dot layer is larger than the number of layers of the second quantum dot layer.

By making the size of the second quantum dot larger than the size of the first quantum dot in this way, the emission wavelength of the second quantum dot layer becomes longer than the emission wavelength of the first quantum dot layer. Further, by increasing the number of layers of the first quantum dot layer to be larger than the number of layers of the second quantum dot layer, the maximum value at the emission wavelength of the first quantum dot layer in the gain spectrum of the active layer becomes larger than the maximum value at the emission wavelength of the second quantum dot layer. In this way, in a certain wavelength band, the variation in gain due to temperature becomes small. Therefore, the gain fluctuation due to the temperature change can be reduced.

The feature may be a semiconductor laser device including a light source for generating laser light. The light source includes the active layer having a first quantum dot layer with a first quantum dot and a second quantum dot layer with a second quantum dot. The dimensions of the second quantum dot are larger than the dimensions of the first quantum dot. The density of the first quantum dot in the first quantum dot layer is larger than the density of the second quantum dot in the second quantum dot layer.

By making the size of the second quantum dot larger than the size of the first quantum dot in this way, the emission wavelength of the second quantum dot layer becomes longer than the emission wavelength of the first quantum dot layer. Further, by increasing the density of the first quantum dot in the first quantum dot layer to be larger than the density of the second quantum dot in the second quantum dot layer, the maximum value at the emission wavelength of the first quantum dot layer in the gain spectrum of the active layer becomes larger than the maximum value at the emission wavelength of the second quantum dot layer. In this way, in a certain wavelength band, the variation in gain due to temperature becomes small. Therefore, the gain fluctuation due to the temperature change can be reduced.

Hereinafter, embodiments of the present disclosure will be described with reference to the drawings. In the following embodiments, the same or equivalent parts are denoted by the same reference numerals.

First Embodiment

The following describes a first embodiment. As shown in FIG. 1, the semiconductor laser device 1 of the present embodiment includes a SOA 2 and a wavelength selection unit 3. The semiconductor laser device 1 is applied to, for example, a laser radar or a LiDAR (Light Detection And Ranging). The SOA 2 and the wavelength selection unit 3 are formed, for example, by processing a semiconductor substrate (not shown) through a semiconductor process.

Figure 2:
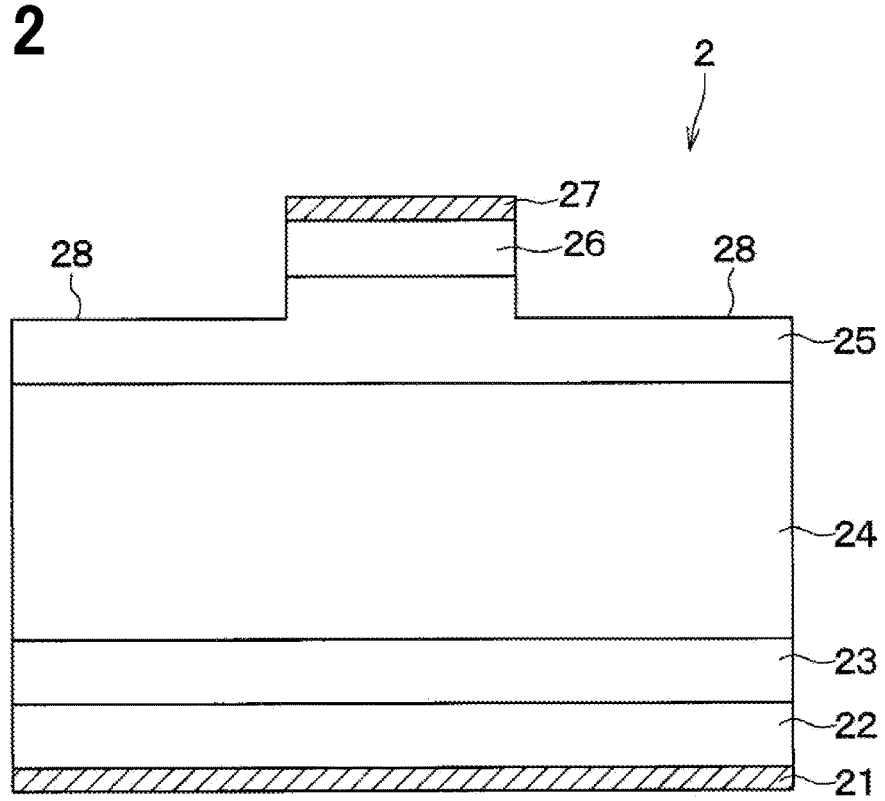
FIG. 2 is a cross-sectional view of the SOA shown in FIG. 1.

The SOA 2 is a light source that generates laser light. As shown in FIG. 2, the SOA 2 includes a stacked structure of a lower electrode 21, a substrate 22, an underclad layer 23, an active layer 24, an overclad layer 25, a contact layer 26, and an upper electrode 27. Note that FIG. 1 shows only the underclad layer 23, the active layer 24, and the overclad layer 25 of the SOA 2.

As shown in FIG. 2, the lower electrode 21 is brought into contact with the back surface side of the substrate 22, that is, the side opposite to the underclad layer 23. The substrate 22 is made of, for example, a GaAs substrate. The underclad layer 23 is made of n-type AIGaAs or the like. The active layer 24 is formed on the upper surface of the underclad layer 23. Details of the active layer 24 will be described later.

The overclad layer 25 is formed on the upper surface of the active layer 24, and is made of, for example, AIGaAs. The contact layer 26 is for making contact with the upper electrode 27, and is formed on the upper surface of the overclad layer 25. The contact layer 26 is made of, for example, GaAs.

The upper electrode 27 is formed on the upper surface of the contact layer 26. A recess 28 is formed to penetrate the upper electrode 27 and the contact layer 26, and to reach the surface layer of the overclad layer 25, and the SOA 2 has a mesa structure in which the upper electrode 27 and the contact layer 26 protrude at positions other than the recess 28.

By applying a voltage that generates a predetermined potential difference between the upper electrode 27 and the lower electrode 21 in the SOA 2 configured in this way, laser oscillation is generated and laser light is emitted from the end face of the active layer 24.

The wavelength selection unit 3 selects the operating wavelength of the semiconductor laser device 1, and includes an etalon filter 31 and a mirror 32 as shown in FIG. 1. The etalon filter 31 transmits only a predetermined wavelength. The etalon filter 31 is arranged so that the light emitted from the active layer 24 is incident, and as shown by the arrow Al in FIG. 1, the light transmitted through the etalon filter 31 is incident on the mirror 32.

The mirror 32 is arranged so as to reflect the light incident from the etalon filter 31 toward the etalon filter 31. As shown by the arrow A2, the light reflected by the mirror 32 passes through the etalon filter 31 and enters the active layer 24, and is emitted from the end face of the active layer 24 opposite to the etalon filter 31 and the mirror 32. By designing the etalon filter 31, the operating wavelength of the semiconductor laser device 1 can be selected by adjusting the wavelength of the transmitted light.

In the present embodiment, the wavelength selection unit 3 selects an operating wavelength so that the active layer 24 oscillates in single mode, that is, oscillates at a single wavelength. Specifically, the wavelength selection unit 3 includes two etalon filters 31. The two etalon filters 31 are etalon filters 31a and 31b, respectively.

The etalon filters 31a and 31b have different free spectrum intervals, and a plurality of wavelengths transmitted by the etalon filter 31a and a plurality of wavelengths transmitted by the etalon filter 31b overlap at only one wavelength. Therefore, as shown in FIG. 1, by placing the etalon filters 31a and 31b on the path of the light emitted from the active layer 24, the light of this one wavelength is incident on the mirror 32 and returns to the active layer 24. As a result, the active layer 24 oscillates in the single mode.

The operating wavelength may be selected so that the active layer 24 oscillates in multimode, but the gain fluctuation can be reduced by oscillating the active layer 24 in the single mode.

Although the case where the wavelength selection unit 3 includes the etalon filter 31 and the mirror 32 has been described here, the wavelength selection unit 3 may include a diffraction grating or the like that reflects only light of a predetermined wavelength. When the wavelength selection unit 3 includes a diffraction grating, the active layer 24 oscillates in a single mode. Further, the operating wavelength of the semiconductor laser device 1 may be selected by applying a voltage or the like from the outside to the wavelength selection unit 3 including an etalon filter, a diffraction grating or the like.

Figure 3:
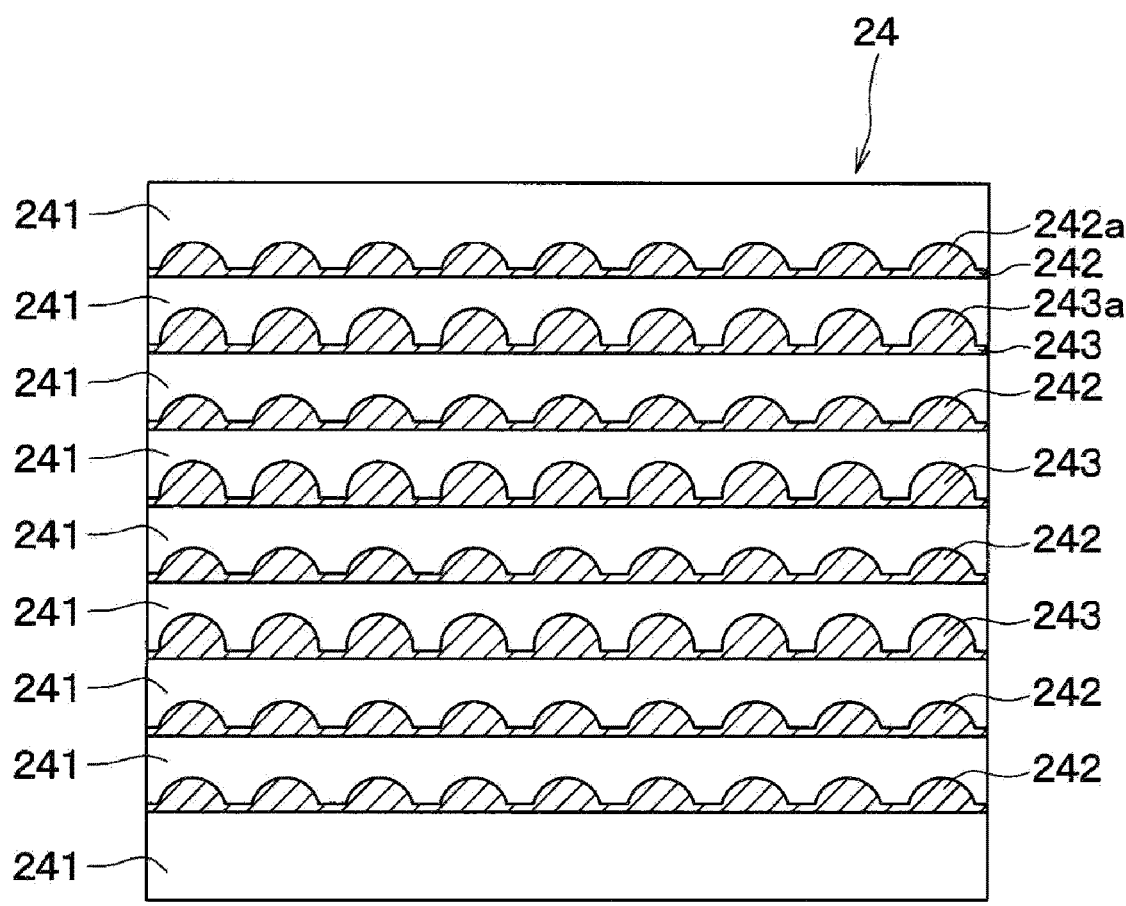
FIG. 3 is a cross-sectional view of the active layer shown in FIG. 2.

The detailed configuration of the active layer 24 will be described. As shown in FIG. 3, the active layer 24 includes an intermediate layer 241. Further, the active layer 24 includes one or more quantum dot layers 242 and one or more quantum dot layers 243, and the intermediate layers 241 and the quantum dot layers 242 or the quantum dot layers 243 are alternately stacked.

The intermediate layer 241 is made of, for example, $In_xGa_{1-x}As$ ($0<=x<1$). The quantum dot layer 242 and the quantum dot layer 243 have a structure provided with granular quantum dots 242a and 243a formed by crystal growth, microfabrication, or the like, respectively, and the front surface side and the back surface side are covered with an intermediate layer 241. The quantum dot layer 242 and the quantum dot layer 243 are made of, for example, InAs and InGaAs, and the active layer 24 including the quantum dot layers 242 and 243 is selectively doped with p-type impurities. The quantum dot layer 242 and the quantum dot layer 243 correspond to the first quantum dot layer and the second quantum dot layer, respectively. The quantum dots 242a and the quantum dots 243a correspond to the first quantum dots and the second quantum dots, respectively.

The gain spectrum of the active layer 24 has a maximum value provided by the light emission from the ground level of the quantum dot layer 242 and the quantum dot layer 243, and the emission wavelength and the gain intensity of the active layer 24 depend on the configuration of the quantum dot layer 242 and the quantum dot layer 243. The gain spectrum can be measured, for example, by the Hakki-Paoli method.

In the present embodiment, in the active layer 24, the quantum dot layer 242 and the quantum dot layer 243 are configured so that the emission wavelength corresponding to the quantum dot layer 243 is longer than the emission wavelength corresponding to the quantum dot layer 242. Further, the quantum dot layer 242 and the quantum dot layer 243 are configured so that the gain of the emission wavelength corresponding to the quantum dot layer 242 is larger than the gain of the emission wavelength corresponding to the quantum dot layer 243.

Specifically, the quantum dot 243a included in the quantum dot layer 243 has a larger height dimension than the quantum dot 242a included in the quantum dot layer 242, whereby the quantum dot layer 243 emits light with the wavelength longer than the quantum dot layer 242. Each of the height dimension of the quantum dots 242a and 243a is the width of the quantum dot layers 242 and 243 in the thickness direction. For example, the emission wavelength of the quantum dot layer 242 is 1230 nm, and the emission wavelength of the quantum dot layer 243 is 1300 nm.

Further, by increasing the number of layers of the quantum dot layer 242 to be larger than the number of layers of the quantum dot layer 243, the gain of the emission wavelength corresponding to the quantum dot layer 242 is larger than the gain of the emission wavelength corresponding to the quantum dot layer 243. For example, as shown in FIG. 3, the active layer 24 includes a five-layer quantum dot layer 242 and a three-layer quantum dot layer 243.

Figure 4:
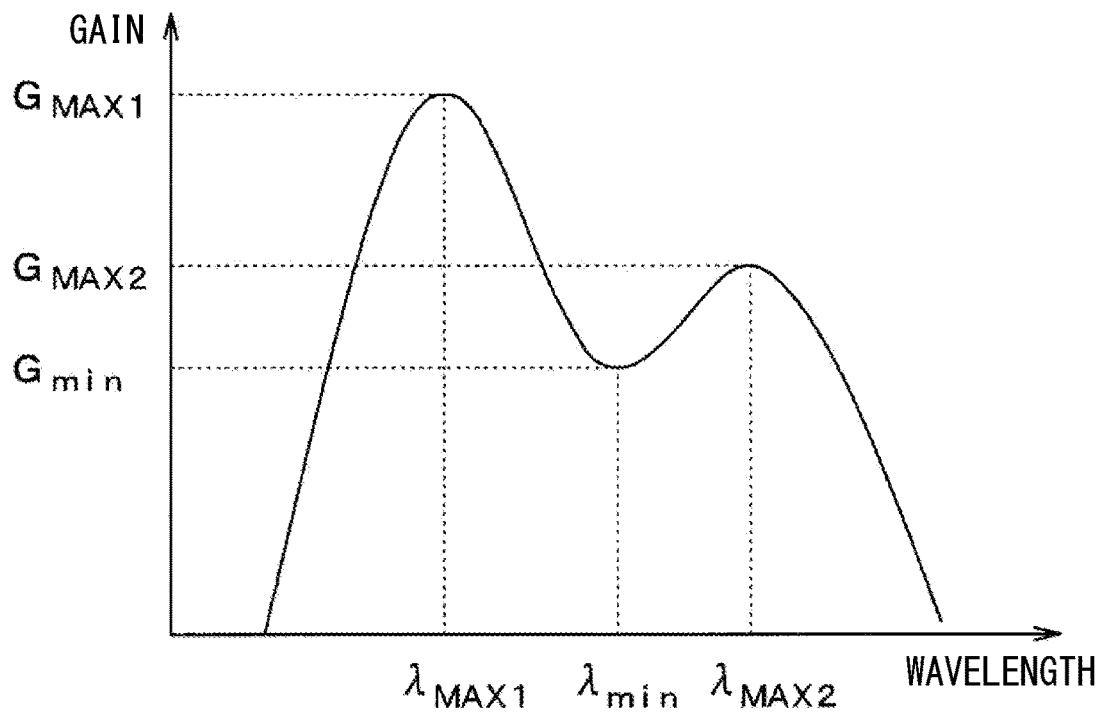
FIG. 4 is a gain spectrum of an active layer.

With such a configuration, the gain spectrum of the active layer 24 is as shown in FIG. 4. That is, the gain spectrum of the active layer 24 has a maximum value of $G_{MAX}$ at a wavelength of $\lambda_{MAX1}$ corresponding to the emission wavelength of the quantum dot layer 242. Further, the gain spectrum has a maximum value of $G_{MAX2}$ at $\lambda_{MAX2}$, which is a wavelength longer than $\lambda_{MAX1}$, corresponding to the emission wavelength of the quantum dot layer 243. Also, $G_{MAX1}$ is larger than $G_{MAX2}$. $\lambda_{MAX1}$ and $\lambda_{MAX2}$ correspond to the first wavelength and the second wavelength, respectively. $G_{MAX1}$ and $G_{MAX2}$ correspond to the first maximum value and the second maximum value, respectively.

In FIG. 4, $\lambda_{min}$ is a wavelength between $\lambda_{MAX1}$ and $\lambda_{MAX2}$, and is a wavelength when the gain spectrum takes a minimum value, and $G_{min}$ is this minimum value. $\lambda_{min}$ corresponds to the third wavelength.

The active layer having a quantum dot layer doped with p-type impurities has the property that the intensity of the gain spectrum and the emission wavelength change with temperature. Hereinafter, the temperature refers to the temperature of the back surface of the lower electrode 21 of the SOA 2, alternatively, it may be the temperature at any position as long as it is the inner or outer surface of the SOA 2.

Figure 5:
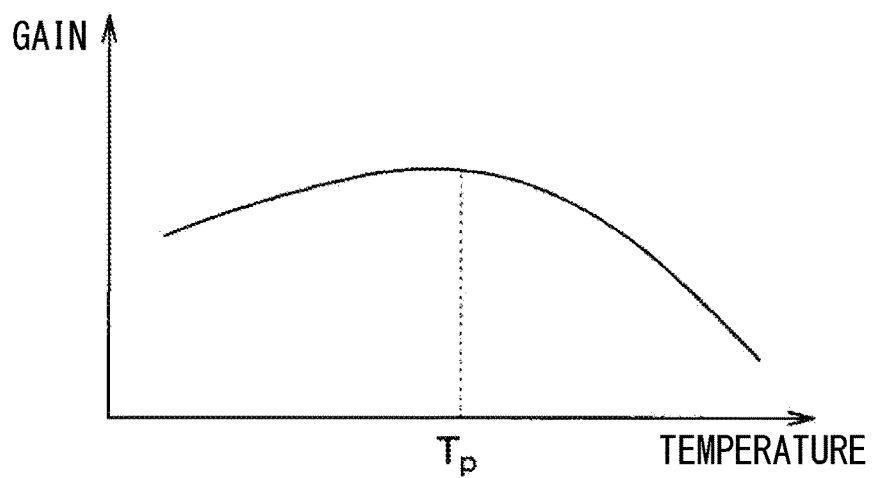
FIG. 5 is a diagram showing a change in gain with temperature.

Specifically, as shown in FIG. 5, the gain intensity becomes maximum at a certain temperature $T_p$, and at a temperature lower than $T_p$ and a temperature higher than $T_p$, the gain becomes smaller than at the temperature $T_p$. $T_p$ is, for example, room temperature of 15° C. or higher and 25° C. or lower. Further, the higher the temperature, the longer the emission wavelength.

That is, when the temperature becomes lower than $T_p$, the intensity of the gain spectrum decreases and the emission wavelength shifts to the short wavelength side. Further, when the temperature becomes higher than $T_p$, the intensity of the gain spectrum decreases and the emission wavelength shifts to the longer wavelength side.

In this way, the gain intensity decreases both when the temperature is lower than Tp and when the temperature is higher than Tp. However, as shown in FIG. 5, since the gain intensity drops sharply at high temperature compared to at low temperature, even if the temperature difference from $T_p$ is the same, the difference from the gain at temperature $T_p$ becomes larger at high temperature than at low temperature.

Due to such temperature characteristics, for example, when the gain spectrum has only one maximum value, if the operating wavelength is fixed, the gain fluctuation due to the temperature change becomes large.

Figure 6:
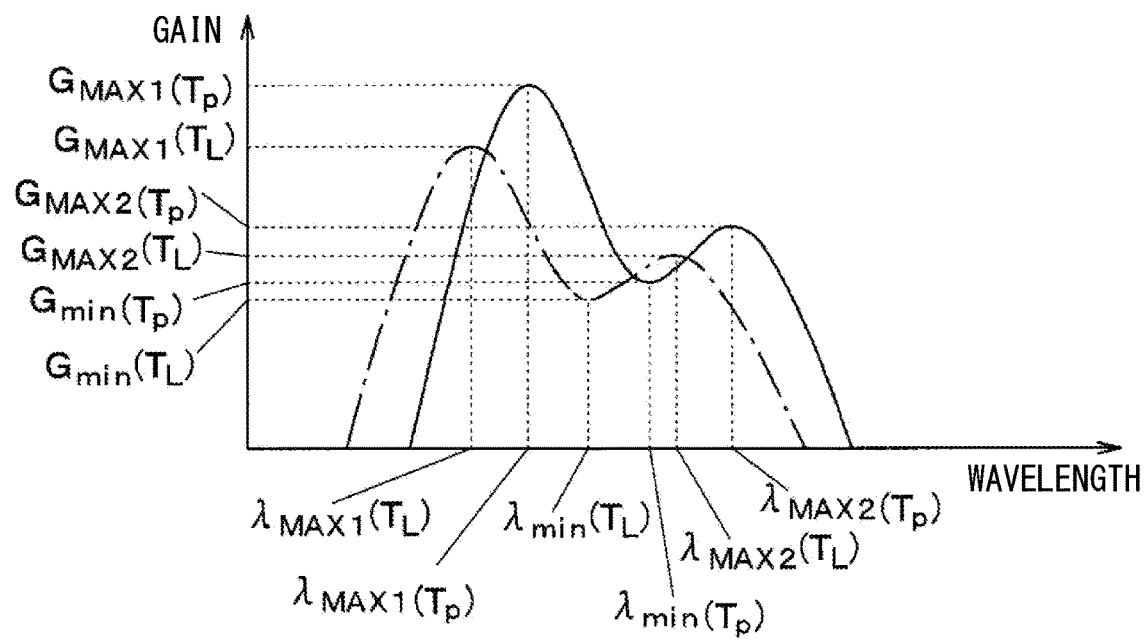
FIG. 6 is a gain spectrum at room temperature and low temperature.
Figure 7:
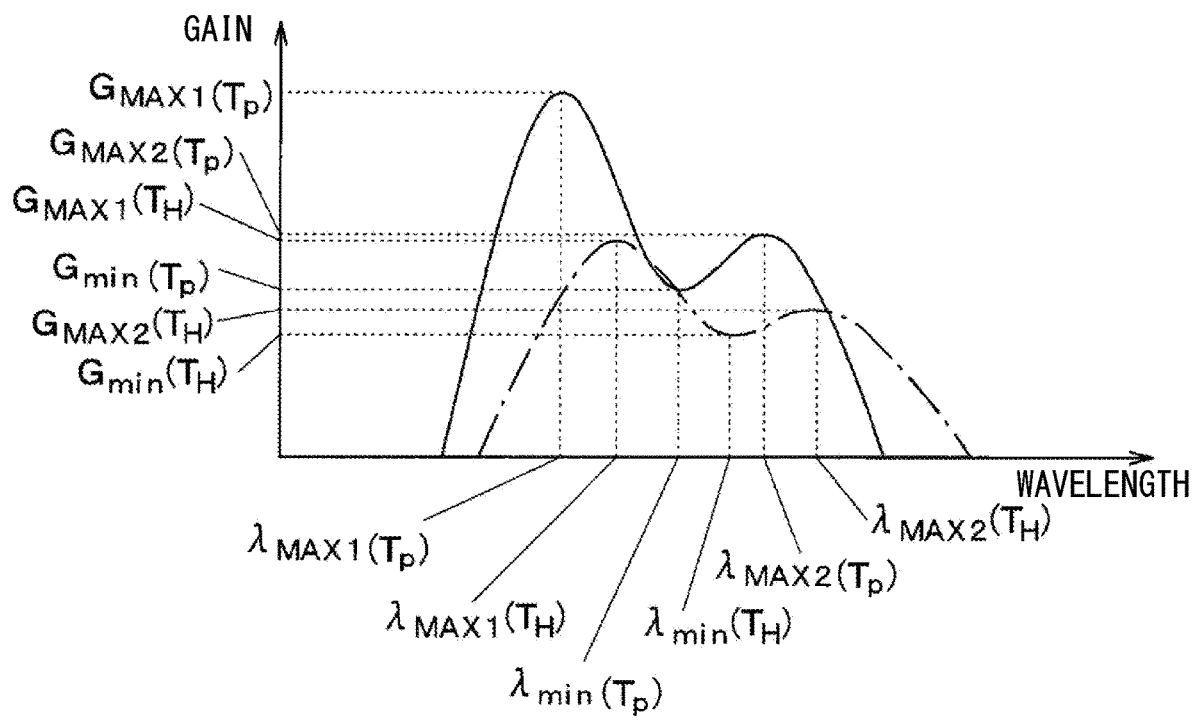
FIG. 7 is a gain spectrum at room temperature and high temperature.

Regarding this, the present inventors have conceived a method of reducing the gain fluctuation corresponding to the characteristic that the gain intensity decreases sharply at high temperature as compared with that at low temperature. The method will be described with reference to FIGS. 6 and 7. FIGS. 6 and 7 are diagrams showing changes in the gain spectrum of the active layer 24 in the present embodiment depending on the temperature.

The solid lines in FIGS. 6 and 7 show the gain spectrum at the temperature $T_p$, the dashed and dotted line in FIG. 6 shows the gain spectrum at the temperature $T_L$ lower than the temperature $T_p$, and the dashed and dotted line in FIG. 7 shows the gain spectrum at the temperature $T_H$ higher than the temperature $T_p$. $\lambda_{MAX1}(T_p)$, $\lambda_{MAX2}(T_p)$, and $\lambda_{min}(T_p)$ are $\lambda_{MAX1}$, $\lambda_{MAX2}$, and $\lambda_{min}$ at the temperature $T_p$, respectively. $\lambda_{MAX1}(T_L)$, $\lambda_{MAX2}(T_L)$, $\lambda_{min}(T_L)$ are $\lambda_{MAX1}$, $\lambda_{MAX2}$, $\lambda_{min}$ at the temperature $T_L$, respectively. $\lambda_{MAX1}(T_H)$, $\lambda_{MAX2}(T_H)$, and $\lambda_{min}(T_H)$ are $\lambda_{MAX1}$, $\lambda_{MAX2}$, and $\lambda_{min}$ at the temperature $T_H$, respectively. $G_{MAX1}(T_p)$, $G_{MAX2}(T_p)$, and $G_{min}(T_p)$ are $G_{MAX1}$, $G_{MAX2}$, and $G_{min}$ at the temperature $T_p$, respectively. $G_{MAX1}(T_L)$, $G_{MAX2}(T_L)$, and $G_{min}(T_L)$ are $G_{MAX1}$, $G_{MAX2}$, and $G_{min}$ at the temperature $T_L$, respectively. $G_{MAX1}(T_H)$, $G_{MAX2}(T_H)$, and $G_{min}(T_H)$ are $G_{MAX1}$, $G_{MAX2}$, and $G_{min}$ at the temperature $T_H$, respectively.

As shown in FIGS. 6 and 7, the gain intensity changes as shown in FIG. 5 even when the gain spectrum has two maximum values as in the present embodiment.

That is, in FIGS. 6 and 7, the difference between $\lambda_{MAX1}$ ($T_H$), $\lambda_{MAX2}$ ($T_H$), $\lambda_{min}$ ($T_H$) and $\lambda_{MAX1}$ ($T_p$), $\lambda_{MAX2}$ ($T_p$), $\lambda_{min}$ ($T_p$) is almost the same order as the difference between $\lambda_{MAX1}$ ($T_L$), $\lambda_{MAX2}$ ($T_L$), $\lambda_{min}$ ($T_L$) and $\lambda_{MAX1}$ ($T_p$), $\lambda_{MAX2}$ ($T_p$), $\lambda_{min}$ ($T_p$), respectively. However, the difference between $G_{MAX1}$ ($T_H$), $G_{MAX2}$ ($T_H$), $G_{min}$ ($T_H$) and $G_{MAX1}$ ($T_p$), $G_{MAX2}$ ($T_p$), $G_{min}$ ($T_p$) is larger than the difference between $G_{MAX1}$ ($T_L$), $G_{MAX2}$ ($T_L$), $G_{min}$ ($T_L$) and $G_{MAX1}$ ($T_p$), $G_{MAX2}$ ($T_p$), $G_{min}$ ($T_p$), respectively.

On the other hand, when $G_{MAX1} > G_{MAX2}$ as in the present embodiment, the variation in gain due to temperature becomes small in a certain wavelength band.

Specifically, when the temperature becomes lower than the temperature $T_p$, the gain spectrum shifts to the short wavelength side, and the maximum value $G_{MAX2}$ is obtained in the vicinity of the wavelength $\lambda_{min}$ at the temperature $T_p$. Since the gain decrease at low temperature is smaller than that at high temperature, by making $G_{MAX2}$ smaller than, for example, $G_{MAX1}$, $G_{MAX2}$ at low temperature becomes close to $G_{min}$ at the temperature $T_p$. Specifically, when the temperature becomes higher than the temperature $T_p$, the gain spectrum shifts to the long wavelength side, and the maximum value $G_{MAX1}$ is obtained in the vicinity of the wavelength $\lambda_{min}$ at the temperature $T_p$. Since the gain decrease at high temperature is larger than that at low temperature, by making $G_{MAX1}$ larger than, for example, $G_{MAX2}$, $G_{MAX1}$ at high temperature becomes close to $G_{min}$ at the temperature $T_p$. That is, the gain spectrum of each temperature passes through the vicinity of the wavelength $\lambda_{min}$ and the gain $G_{min}$ at the temperature $T_p$ in common.

As a result, at the wavelength between $\lambda_{MAX1}$ and $\lambda_{MAX2}$ at the temperature $T_p$, the change in gain due to temperature becomes small. Therefore, by selecting this wavelength as the operating wavelength by the wavelength selection unit 3, it is possible to reduce the gain fluctuation due to the temperature change.

FIGS. 8 to 11 are graphs showing the results of experiments conducted by the present inventors. In the experiment, the temperature was changed in 7 ways in the range of −20° C. to 105° C., and the gain at each temperature was examined. The graphs of FIGS. 8 to 11 are standardized so that the gain intensity is 1 when the temperature is 25° C. and the operating wavelength is 1280 nm.

Figure 8:
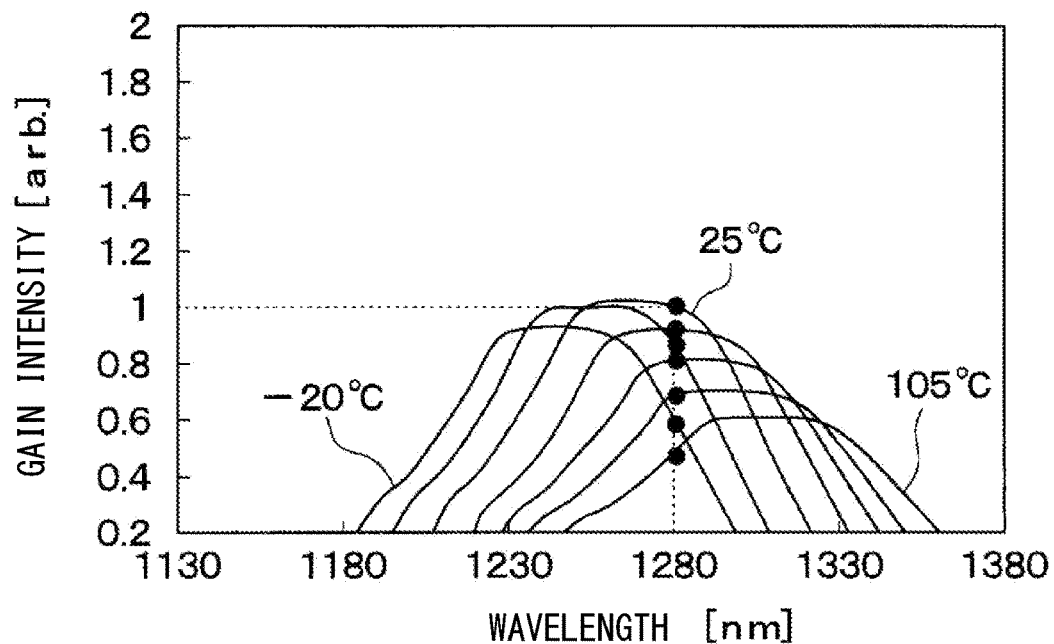
FIG. 8 is a gain spectrum from −20° C. to 105° C. in a comparative example.
Figure 9:
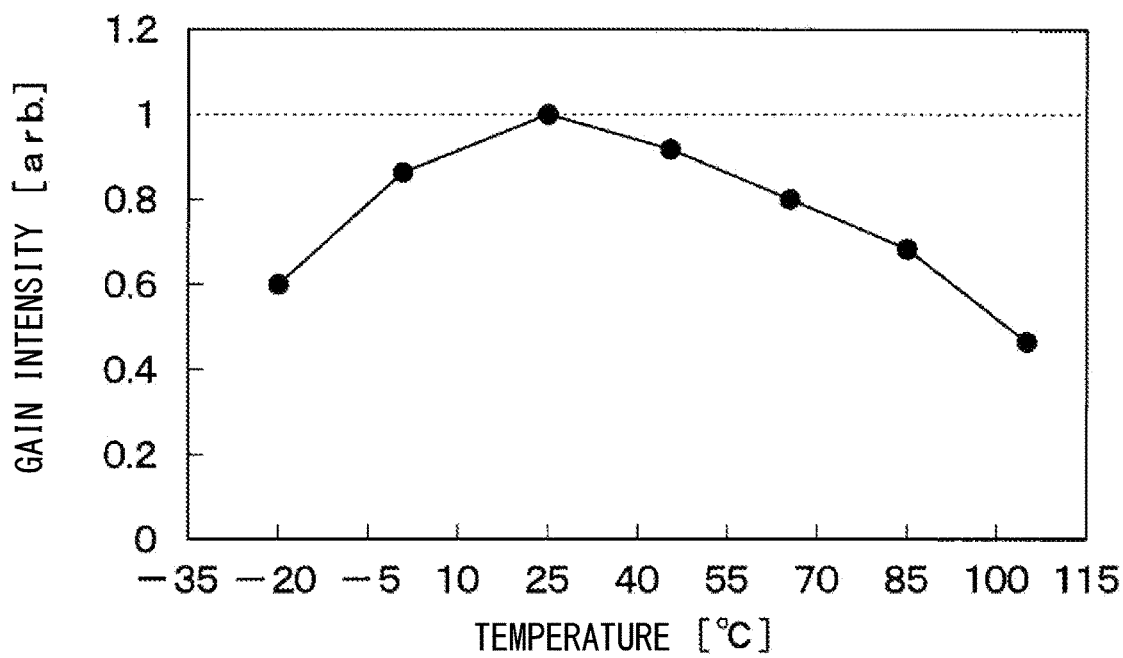
FIG. 9 is a gain intensity from −20° C. to 105° C. in a comparative example.
Figure 10:
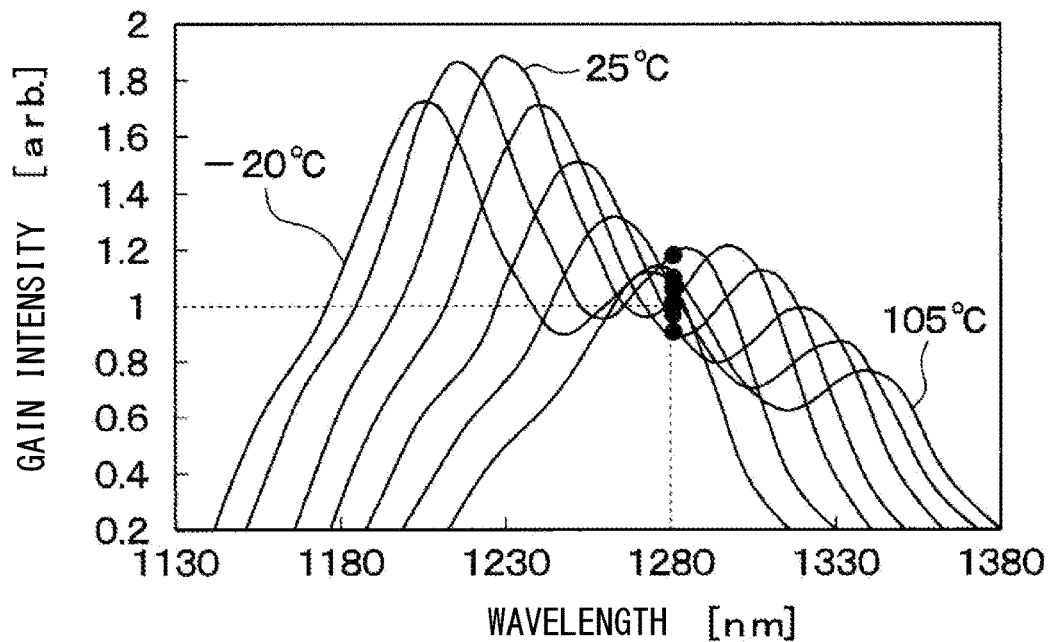
FIG. 10 is a gain spectrum from −20° C. to 105° C. in the first embodiment.
Figure 11:
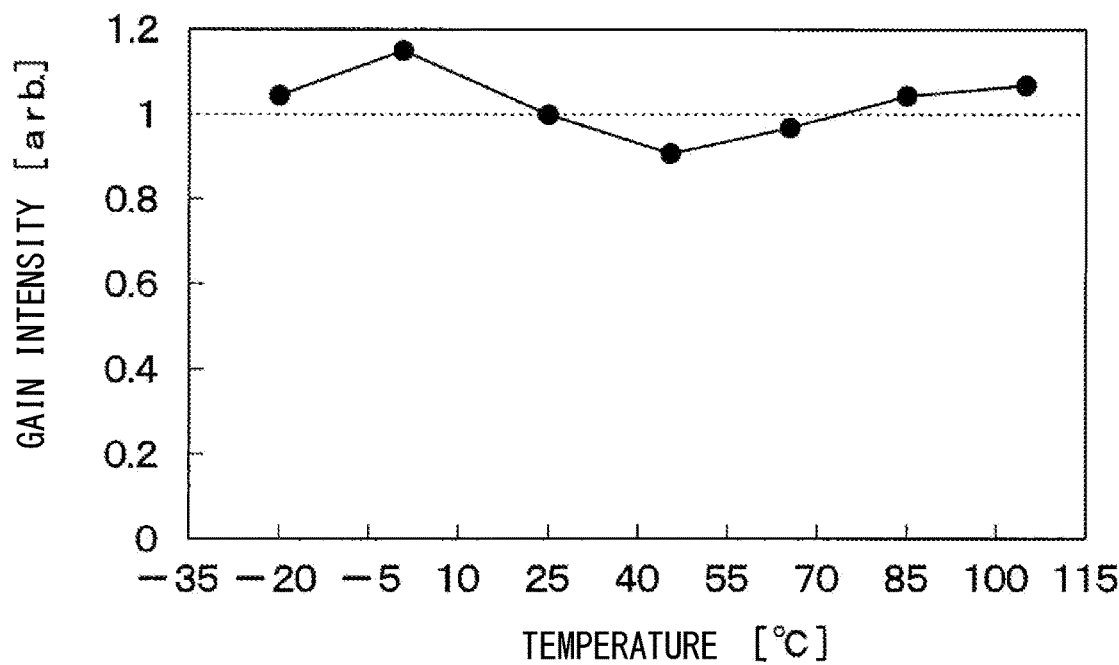
FIG. 11 is a gain intensity from −20° C. to 105° C. in the first embodiment.

The plurality of graphs of FIG. 8 each correspond to the plurality of plots of FIG. 9, and the plurality of graphs of FIG. 10 each correspond to the plurality of plots of FIG. 11. Further, the plurality of graphs of FIGS. 8 and 10 are arranged in the order of temperature, and the leftmost graph is the experimental result when the temperature is −20° C. and the rightmost graph is the experimental result when the temperature is 105° C.

FIGS. 8 and 9 are experimental results in a comparative example. In the comparative example, the quantum dot layer 242 and the quantum dot layer 243 are alternately formed by four layers with an intermediate layer 241 sandwiched between them. The emission wavelengths of the quantum dot layer 242 and the quantum dot layer 243 are set to 1260 nm and 1300 nm, respectively. As described above, when the difference between the emission wavelengths of the quantum dot layer 242 and the quantum dot layer 243 is set to about 40 nm, the peak of the gain spectrum becomes a flat shape in the range of about 30 nm. In the comparative example, as shown in FIG. 8, the gain variation due to temperature is large at any wavelength, and as shown in FIG. 9, a gain variation of 51% occurs.

FIGS. 10 and 11 are experimental results in this embodiment. In the experiment, the emission wavelengths of the quantum dot layer 242 and the quantum dot layer 243 at 25° C. were set to 1230 nm and 1300 nm, respectively, and the number of layers of the quantum dot layer 242 and the number of layers in the quantum dot layer 243 were set to 5 layers and 3 layers, respectively. As a result, $G_{MAX1} > G_{MAX2}$. In the present embodiment, as shown in FIG. 10, the gain variation due to temperature is small at a wavelength near 1280 nm, and as shown in FIG. 11, the gain variation is reduced to 26%. As described above, in the present embodiment, the gain fluctuation is reduced in a wide temperature range as compared with the comparative example.

A method for further reducing the fluctuation of the gain will be described. First, it may be desirable that the gain spectra of each temperature are dense at the operating wavelength. For that purpose, it may be desirable that the gain spectrum shifts along the portion of the gain spectrum at the temperature $T_p$ from $\lambda_{MAX2}$, $G_{MAX2}$ to $\lambda_{min}$, $G_{min}$, when the temperature drops from $T_p$. Further, when the temperature rises from $T_p$, it may be desirable that the gain spectrum shifts along the portion of the gain spectrum at the temperature $T_p$ from $\lambda_{MAX1}$ and $G_{MAX1}$ toward $\lambda_{min}$ and $G_{min}$.

When the gain spectrum shifts in this way, the temperature changes significantly, and when $\lambda_{MAX2}$ ($T_L$)=$\lambda_{min}$ ($T_p$), an equation of |$G_{MAX2}$ ($T_L$)−$G_{min}$ ($T_p$)|<|$G_{MAX2}$ ($T_L$)−$G_{MAX2}$ ($T_p$)| is satisfied. Further, when $\lambda_{min}$ ($T_p$)=$\lambda_{MAX1}$ ($T_H$), an equation of |$G_{MAX1}$ ($T_H$)−$G_{min}$ ($T_p$)|<|$G_{MAX1}$ ($T_H$)−$G_{MAX1}$ ($T_p$)| is satisfied. That is, $G_{MAX2}$ at the temperature $T_L$ is closer to $G_{min}$ at the temperature $T_p$ than $G_{MAX2}$ at the temperature $T_p$, and $G_{MAX1}$ at the temperature $T_H$ is closer to $G_{min}$ at the temperature $T_p$ than $G_{MAX1}$ at the temperature $T_p$. As a result, the gain fluctuation due to the temperature change can be further reduced.

Such a gain spectrum can be obtained, for example, by setting the number of layers of the quantum dot layer 242 and the quantum dot layer 243 as follows. That is, $\lambda_{MAX2}$ ($T_L$)=$\lambda_{min}$ ($T_p$)=$\lambda_{MAX1}$ ($T_H$), the number of quantum dot layers 242 is defined as X, the number of quantum dot layers 243 is defined as Y, and X is the integer closest to {$G_{MAX2}$ ($T_L$)/$G_{MAX2}$ ($T_p$)}·{$G_{MAX1}$ ($T_p$)/$G_{MAX1}$ ($T_H$)}·Y.

Figure 12:
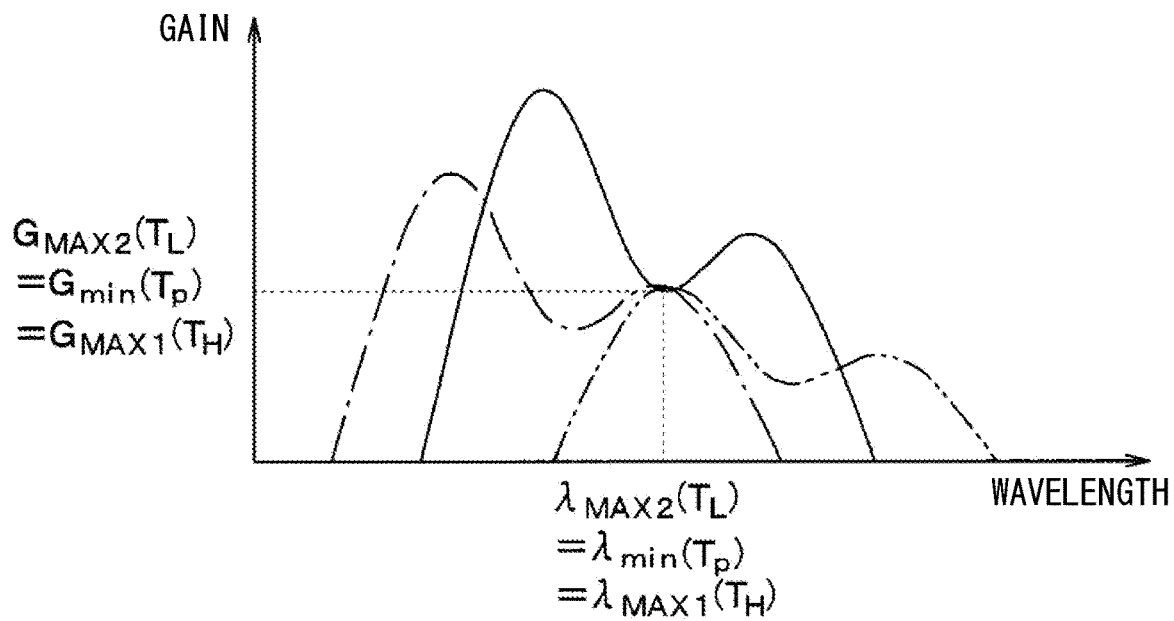
FIG. 12 is a diagram for explaining a method for further reducing gain fluctuation.

Further, as shown in FIG. 12, when $\lambda_{MAX2}$ ($T_L$)=$\lambda_{min}$ ($T_p$)=$\lambda_{MAX1}$ ($T_H$), it may be desirable that $G_{MAX2}$ ($T_L$)=$G_{min}$ ($T_p$)=$G_{MAX1}$ ($T_H$). As a result, the gain fluctuation due to the temperature change can be further reduced. In FIG. 12, the solid line, the dashed and dotted line, and the dashed and double-dotted line indicate the gain spectra at the temperatures $T_p$, $T_L$, and $T_H$, respectively.

Further, since the gain variation becomes small near the wavelength $\lambda_{min}$ ($T_p$), the operating wavelength may be longer than MAXI ($T_p$) and shorter than $\lambda_{MAX2}$ ($T_p$) in order to further reduce the gain variation due to temperature change. Further, it may be desirable that the operating wavelength is closer to $\lambda_{min}$ ($T_p$) than $\lambda_{MAX1}$ ($T_p$) and closer to $\lambda_{min}$ ($T_p$) than $\lambda_{MAX2}$ ($T_p$).

As described above, in the present embodiment, by setting $G_{MAX1} > G_{MAX2}$, the variation in gain in a predetermined wavelength band becomes small. Therefore, even when the operating wavelength is fixed, the gain fluctuation due to the temperature change can be reduced.

Second Embodiment

A second embodiment will be described. Since the present embodiment is similar to the first embodiment except that the configuration of the active layer 246 is changed as compared with the first embodiment, only portions different from the first embodiment will be described.

Figure 13:
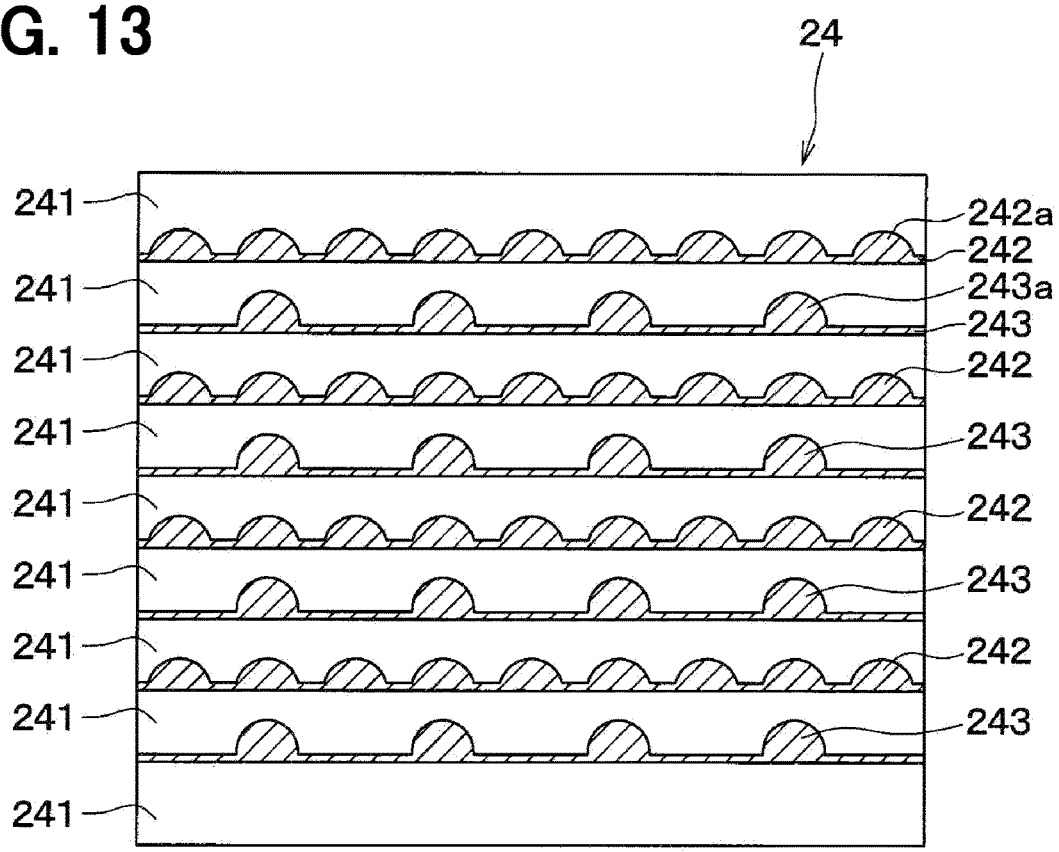
FIG. 13 is a cross-sectional view of an active layer according to a second embodiment.

As shown in FIG. 13, in the present embodiment, four quantum dot layers 242 and four quantum dot layers 242a are formed. Further, the density of the quantum dots 242a in the quantum dot layer 242 is made higher than the density of the quantum dots 243a in the quantum dot layer 243.

The maximum value of the gain spectrum can also be changed by the quantum dot density, and by making the quantum dot density of the quantum dot layer 242 larger than the quantum dot density of the quantum dot layer 243, $G_{MAX1}$ becomes larger than $G_{MAX2}$.

For example, by setting the quantum dot density of the quantum dot layer 242 to $6.0 \times 10^{10}$ /cm$^2$ and the quantum dot density of the quantum dot layer 243 to $3.6 \times 10_{10}$/cm$^2$, the gain spectrum similar to that in FIG. 10 is obtained.

As described above, the same effect as that of the first embodiment can be obtained even in the present embodiment in which $G_{MAX1} > G_{MAX2}$ depending on the quantum dot density.

Third Embodiment

A third embodiment will be described. Since this embodiment is the same as the first embodiment in that the number of maximum values of the gain spectrum is changed with respect to the first embodiment, only the parts different from the first embodiment will be described.

Here, a case where the active layer 24 includes three or more quantum dot layers having different emission wavelengths and the gain spectrum has a maximum value at three or more wavelengths corresponding to the emission wavelengths of each quantum dot layer will be described.

Figure 14:
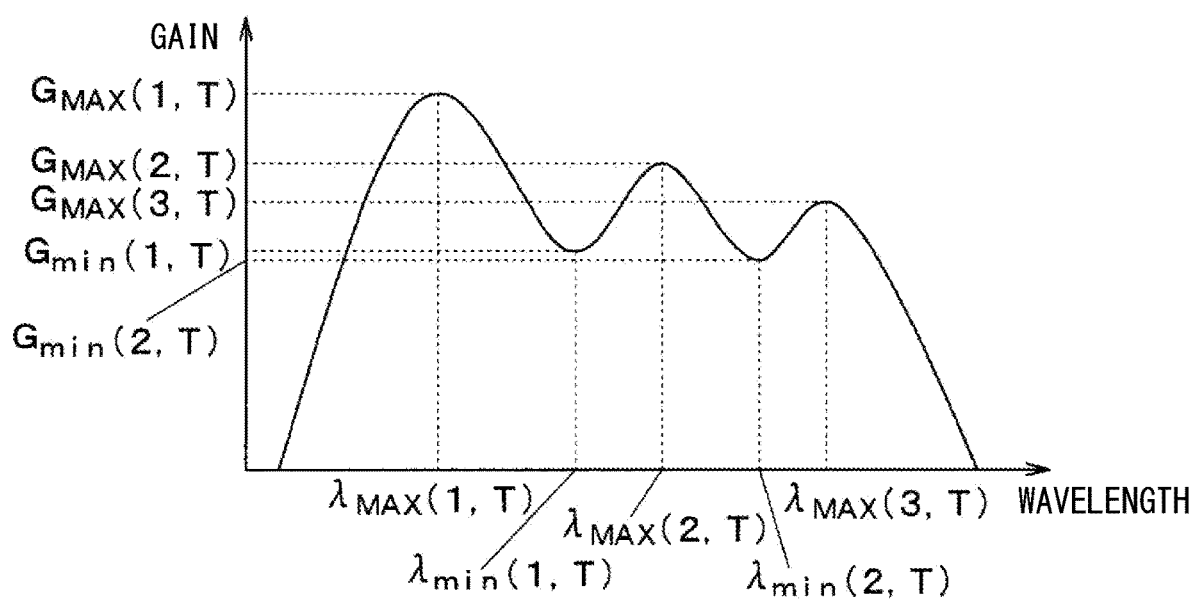
FIG. 14 is a gain spectrum of an active layer according to a third embodiment.

Here, N is defined as the number of maximum values in the gain spectrum. As shown in FIG. 14, the i-th maximum value counted from the short wavelength side at the temperature T is $G_{MAX}$ (i, T), and the i-th minimum value counted from the short wavelength side is $G_{min}$ (i, T). Further, the wavelength having the maximum value $G_{MAX}$ (i, T) is defined as $\lambda_{MAX}$ (i, T), and the wavelength having the minimum value $G_{min}$ (i, T) is defined as $\lambda_{min}$ (i, T). Note that FIG. 14 and FIGS. 15 and 16 described later show the case of N=3.

When there are three or more maximum values of the gain spectrum, M is an integer of 1 or more and less than N, and an equation of $G_{MAX}$ (M, $T_p$) > $G_{MAX}$ (M+1, $T_p$) is set. The gain fluctuation becomes small in the wavelength band between $\lambda_{MAX}$ (M, $T_p$) and $\lambda_{MAX}$ (M+1, $T_p$), similar to the first embodiment. In this case, $G_{MAX}$ (M, T) corresponds to the first maximum value at the temperature T, and $G_{MAX}$ (M+1, T) corresponds to the second maximum value at the temperature T. Further, $\lambda_{MAX}$ (M, T), $\lambda_{MAX}$ (M+1, T), and $\lambda_{min}$ (M, T) correspond to the first wavelength, the second wavelength, and the third wavelength at the temperature T, respectively.

That is, $G_{MAX}$(M, TL), $G_{MAX}$(M+1, $T_L$), and $G_{min}$ (M, $T_L$) correspond to $G_{MAX1}$ ($T_L$), $G_{MAX2}$ ($T_L$), and $G_{min}$ ($T_L$) of the first embodiment. Further, $G_{MAX}$ (M, $T_p$), $G_{MAX}$ (M+1, $T_p$), and $G_{min}$ (M, $T_p$) correspond to $G_{MAX1}$ ($T_p$), $G_{MAX2}$ ($T_p$), and $G_{min}$ ($T_p$) of the first embodiment. Further, $G_{MAX}$ (M, $T_H$), $G_{MAX}$ (M+1, $T_H$), and $G_{min}$ (M, $T_H$) correspond to $G_{MAX1}$ ($T_H$), $G_{MAX2}$ ($T_H$), and $G_{min}$ ($T_H$) of the first embodiment.

Further, $\lambda_{MAX}$ (M, $T_L$), $\lambda_{MAX}$ (M+1, $T_L$), and $\lambda_{min}$ (M, $T_L$) correspond to $\lambda_{MAX1}$ ($T_L$), $\lambda_{MAX2}$ ($T_L$), and $\lambda_{min}$ ($T_L$) of the first embodiment. Further, $\lambda_{MAX}$ (M, $T_p$), $\lambda_{MAX}$ (M+1, $T_p$), and $\lambda_{min}$ (M, $T_p$) correspond to $\lambda_{MAX1}$ ($T_p$), $\lambda_{MAX2}$ ($T_p$), and $\lambda_{min}$ ($T_p$) of the first embodiment. Further, $\lambda_{MAX}$ (M, $T_H$), $\lambda_{MAX}$ (M+1, $T_H$), and $\lambda_{min}$ (M, $T_H$) correspond to $\lambda_{MAX1}$ ($T_H$), $\lambda_{MAX2}$ ($T_H$), and $\lambda_{min}$ ($T_H$) of the first embodiment.

In order to obtain such a gain spectrum, the active layer 24 is configured to have one or more layer with N types of quantum dot layers corresponding to wavelengths $\lambda_{MAX}$ (1, T) to $\lambda_{MAX}$ (N, T). Then, the number of quantum dot layers corresponding to the wavelength $\lambda_{MAX}$ (M, T) is made larger than the number of quantum dot layers corresponding to the wavelength $\lambda_{MAX}$ (M+1, T). The quantum dot layer corresponding to the wavelength $\lambda_{MAX}$ (M, T) corresponds to the first quantum dot layer, and the quantum dot layer corresponding to the wavelength $\lambda_{MAX}$ (M+1, T) corresponds to the second quantum dot layer.

Also in the present embodiment, as in the first embodiment, the gain fluctuation can be further reduced by performing the following.

Figure 15:
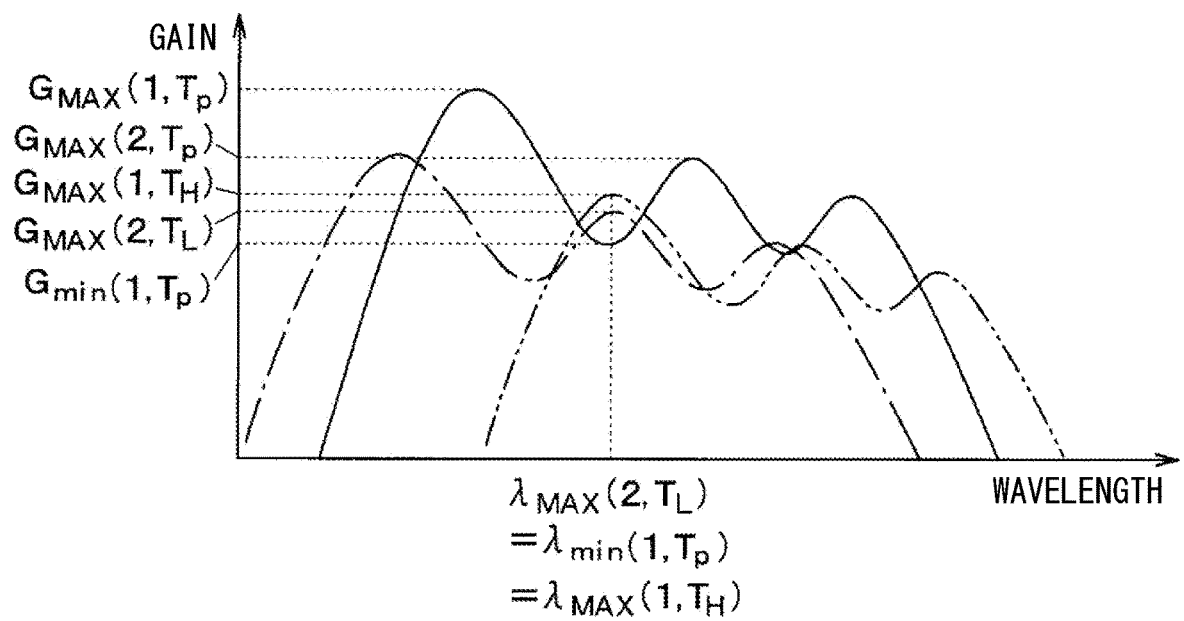
FIG. 15 is a diagram for explaining reduction of gain fluctuation in the third embodiment.

That is, as shown in FIG. 15, the temperatures $T_L$ and $T_H$ are set to the temperatures that satisfy $\lambda_{MAX}$(M+1, $T_L$)=$\lambda_{min}$ (M, $T_p$)=$\lambda_{MAX}$ (M, $T_H$). Then, equations of |$G_{MAX}$ (M+1, $T_L$)−$G_{min}$ (M, $T_p$)|<|$G_{MAX}$ (M+1, $T_L$)−$G_{MAX}$ (M+1, $T_p$)| and |$G_{MAX}$ (M, $T_H$)−$G_{min}$ (M, $T_p$)|<|$G_{MAX}$ (M, $T_H$)−$G_{MAX}$ (M, $T_p$)| are satisfied. As a result, the gain fluctuation due to the temperature change can be further reduced.

Figure 16:
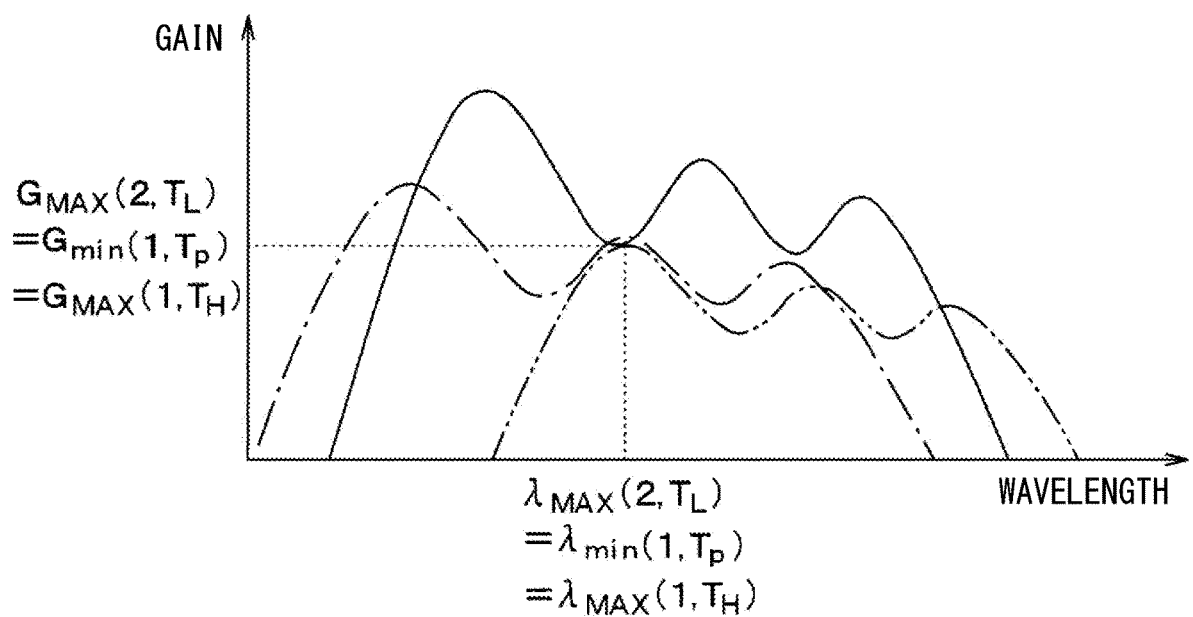
FIG. 16 is a diagram for explaining a method for further reducing gain fluctuation.

In FIG. 15 and FIG. 16 described later, the solid line, the dashed and dotted line, and the dashed and double-dotted line indicate the gain spectra at the temperatures $T_p$, $T_L$, and $T_H$, respectively. Further, in FIGS. 15 and 16, the case where M=1 is shown.

Such a gain spectrum can be obtained, for example, by setting the number of quantum dot layers as follows. That is, the temperatures $T_L$ and $T_H$ are set to the temperatures that satisfy $\lambda_{MAX}$(M+1, $T_L$)=$\lambda_{min}$ (M, $T_p$)=$\lambda_{MAX}$(M, $T_H$), and the number of quantum dot layers corresponding to the wavelengths $\lambda_{MAX}$(M, T) and $\lambda_{MAX}$(M+1, T) are defined as X and Y, respectively. Then, X is an integer closest to a value of $\{G_{MAX}$ (M+1, $T_L$)/$G_{MAX}$ (M+1, $T_p$)$\} \cdot \{G_{MAX}$ (M, $T_p$)/$G_{MAX}$ (M, $T_H$)$\} \cdot Y$.

Further, as shown in FIG. 16, when an equation of $\lambda_{MAX}$ (M+1, $T_L$)=$\lambda_{min}$ (M, $T_p$)=$\lambda_{MAX}$(M, $T_H$) is satisfied, it may be preferable to satisfy an equation of $G_{MAX}$ (M+1, $T_L$)=$G_{min}$ (M, $T_p$)=$G_{MAX}$ (M, $T_H$).

Further, since the gain variation becomes small near the wavelength $\lambda_{min}$ (M, $T_p$), the operating wavelength may be longer than $\lambda_{MAX}$ (M, $T_p$) and shorter than $A_{MAX}$ (M+1, $T_p$) in order to further reduce the gain variation due to temperature change. Further, it may be desirable that the operating wavelength is closer to $\lambda_{min}$ (M, $T_p$) than $\lambda_{MAX}$ (M, $T_p$) and closer to $\lambda_{min}$ (M, $T_p$) than $\lambda_{MAX}$ (M, $T_p$).

In the present embodiment in which three or more maximum values of the gain spectrum exist, the same effect as in the first embodiment can be obtained.

Other Embodiments

The present disclosure is not limited to the above embodiment, and can be appropriately modified within the scope described in the disclosure. Individual elements or features of a particular embodiment are not necessarily essential unless it is specifically stated that the elements or the features are essential in the foregoing description, or unless the elements or the features are obviously essential in principle. Further, in each of the embodiments described above, when numerical values such as the number, numerical value, quantity, range, and the like of the constituent elements of the embodiment are referred to, except in the case where the numerical values are expressly indispensable in particular, the case where the numerical values are obviously limited to a specific number in principle, and the like, the present disclosure is not limited to the specific number.

For example, in the third embodiment, if at least a part of two adjacent maximum values satisfy the same conditions as those of $G_{MAX1}$ and $G_{MAX2}$ in the first embodiment, the gain fluctuation due to the temperature change can be reduced. That is, when an equation of $G_{MAX}(1, T_p) > G_{MAX}(2, T_p)$ is satisfied, then an equation of $G_{MAX}(2, T_p) < G_{MAX}(3, T_p)$ may be satisfied. Also in this case, the gain fluctuation is reduced at the wavelength between $\lambda_{MAX}(1, T_p)$ and $\lambda_{MAX}(2, T_p)$. Similarly, when an equation of $G_{MAX}(2, T_p) > G_{MAX}(3, T_p)$ is satisfied, then an equation of $G_{MAX}(1, T_p) < G_{MAX}(2, T_p)$ may be satisfied. The same applies when there are four or more maximum values of the gain spectrum.

Further, the number of the quantum dot layers 242 may be larger than the number of the quantum dot layers 243 as in the first embodiment, and the density of the quantum dots 242a in the quantum dot layer 242 may be increased to be larger than the density of the quantum dots 243a in the quantum dot layer 243 as in the second embodiment.

Further, in the third embodiment, the magnitude of the gain may be adjusted by the quantum dot density as in the second embodiment. In this case, the density of the quantum dot layer corresponding to the wavelength $\lambda_{MAX}(M, T)$ may be made larger than the density of the quantum dot layer corresponding to the wavelength $\lambda_{MAX}(M+1, T)$.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor laser device comprising:
an active layer having a structure including one or more first quantum dot layers and one or more second quantum dot layers having an emission wavelength longer than that of the first quantum dot layer, wherein:
a gain spectrum of the active layer has maximum values at a first wavelength and a second wavelength longer than the first wavelength, corresponding to the emission wavelength of the first quantum dot layer and the emission wavelength of the second quantum dot layer;
the maximum value of the gain spectrum at the first wavelength is defined as a first maximum value;
the maximum value of the gain spectrum at the second wavelength is defined as a second maximum value;
the first maximum value is larger than the second maximum value;
a numerical number of the first quantum dot layers in the active layer is larger than a numerical number of the second quantum dot layers;
a wavelength between the first wavelength and the second wavelength when the gain spectrum takes a minimum value is defined as a third wavelength;
a temperature at which an intensity of the gain spectrum is maximum is defined as $T_p$;
the second wavelength at a temperature $T_L$ lower than the temperature $T_p$, the third wavelength at the temperature $T_p$, and the first wavelength at a temperature $T_H$ higher than the temperature $T_p$ are equal;
the numerical number of the first quantum dot layers is defined as X;
the numerical number of the second quantum dot layers is defined as Y;
the first maximum value at the temperature $T_p$ is defined as $G_{MAX1}(T_p)$;
the second maximum value at the temperature $T_p$ is defined as $G_{MAX2}(T_p)$;
the second maximum value at the temperature $T_L$ is defined as $G_{MAX2}(T_L)$;
the first maximum value at the temperature $T_H$ is defined as $G_{MAX1}(T_H)$; and
X is an integer closest to $\{G_{MAX2}(T_L) / G_{MAX2}(T_p)\} \cdot \{G_{MAX1}(T_p) / G_{MAX1}(T_H)\} \cdot Y$.

2. The semiconductor laser device according to claim 1, wherein:
a density of quantum dots in the first quantum dot layer is larger than a density of quantum dots in the second quantum dot layer.

3. The semiconductor laser device according to claim 1, wherein:
the second maximum value at the temperature $T_L$ is closer to the minimum value at the temperature $T_p$ than the second maximum value at the temperature $T_p$; and
the first maximum value at the temperature $T_H$ is closer to the minimum value at the temperature $T_p$ than the first maximum value at the temperature $T_p$.

4. The semiconductor laser device according to claim 1, further comprising:
a wavelength selection unit for selecting an operating wavelength of the active layer, wherein:
the wavelength selection unit selects the operating wavelength to be longer than the first wavelength at the temperature $T_p$ and shorter than the second wavelength at the temperature $T_p$.

5. The semiconductor laser device according to claim 4, wherein:
the wavelength selection unit selects the operating wavelength to be closer to the third wavelength at the temperature $T_p$ than the first wavelength at the temperature $T_p$, and to be closer to the third wavelength at the temperature $T_p$ than the second wavelength at the temperature $T_p$.

6. The semiconductor laser device according to claim 4, wherein:
the wavelength selection unit selects the operating wavelength so as to oscillate the active layer in a single mode.

7. The semiconductor laser device according to claim 1, wherein
the second maximum value at the temperature $T_L$, the minimum value at the temperature $T_p$, and the first maximum value at the temperature $T_H$ are equal to each other.

8. The semiconductor laser device according to claim 1, wherein:
the active layer has a characteristic that an intensity of the gain spectrum decreases and an emission wavelength shifts to a short wavelength side when a temperature of the active layer becomes lower than the temperature $T_p$, and the intensity of the gain spectrum decreases and the emission wavelength shifts to a long wavelength side when the temperature of the active layer becomes higher than the temperature $T_p$.

9. The semiconductor laser device according to claim 1, wherein:
the active layer includes a p-type impurity.

10. A semiconductor laser device comprising:

a light source that generates a laser light, wherein:

the light source includes an active layer having one or more first quantum dot layers with first quantum dots and one or more second quantum dot layers with second quantum dots;

a size of each of the second quantum dots is larger than a size of each of the first quantum dots;

a gain spectrum of the active layer has maximum values at a first wavelength and a second wavelength longer than the first wavelength, corresponding to the emission wavelength of the first quantum dot layer and the emission wavelength of the second quantum dot layer;

the maximum value of the gain spectrum at the first wavelength is defined as a first maximum value;

the maximum value of the gain spectrum at the second wavelength is defined as a second maximum value;

the first maximum value is larger than the second maximum value;

a numerical number of the first quantum dot layers is larger than a numerical number of the second quantum dot layers;

a wavelength between the first wavelength and the second wavelength when the gain spectrum takes a minimum value is defined as a third wavelength;

a temperature at which an intensity of the gain spectrum is maximum is defined as $T_p$;

the second wavelength at a temperature $T_L$ lower than the temperature $T_p$, the third wavelength at the temperature $T_p$, and the first wavelength at a temperature $T_H$ higher than the temperature $T_p$ are equal;

the numerical number of the first quantum dot layers is defined as X;

the numerical number of the second quantum dot layers is defined as Y;

the first maximum value at the temperature $T_p$ is defined as $G_{MAX1}(T_p)$;

the second maximum value at the temperature $T_p$ is defined as $G_{MAX2}(T_p)$;

the second maximum value at the temperature $T_L$ is defined as $G_{MAX2}(T_L)$;

the first maximum value at the temperature $T_H$ is defined as $G_{MAX1}(T_H)$; and X is an integer closest to $\{G_{MAX2}(T_L) / G_{MAX2}(T_p)\} \cdot \{G_{MAX1}(T_p) / G_{MAX1}(T_H)\} \cdot Y$.

11. A semiconductor laser device comprising:

a light source that generates a laser light, wherein:

the light source includes an active layer having a first quantum dot layer with first quantum dots and a second quantum dot layer with second quantum dots;

a size of each of the second quantum dots is larger than a size of each of the first quantum dots;

a density of the first quantum dots in the first quantum dot layer is higher than a density of the second quantum dots in the second quantum dot layer;

a gain spectrum of the active layer has maximum values at a first wavelength and a second wavelength longer than the first wavelength, corresponding to the emission wavelength of the first quantum dot layer and the emission wavelength of the second quantum dot layer;

the maximum value of the gain spectrum at the first wavelength is defined as a first maximum value;

the maximum value of the gain spectrum at the second wavelength is defined as a second maximum value;

the first maximum value is larger than the second maximum value;

a numerical number of the first quantum dot layers in the active layer is larger than a numerical number of the second quantum dot layers;

a wavelength between the first wavelength and the second wavelength when the gain spectrum takes a minimum value is defined as a third wavelength;

a temperature at which an intensity of the gain spectrum is maximum is defined as $T_p$;

the second wavelength at a temperature $T_L$ lower than the temperature $T_p$, the third wavelength at the temperature $T_p$, and the first wavelength at a temperature $T_H$ higher than the temperature $T_p$ are equal;

the numerical number of the first quantum dot layers is defined as X;

the numerical number of the second quantum dot layers is defined as Y;

the first maximum value at the temperature $T_p$ is defined as $G_{MAX1}(T_p)$;

the second maximum value at the temperature $T_p$ is defined as $G_{MAX2}(T_p)$;

the second maximum value at the temperature $T_L$ is defined as $G_{MAX2}(T_L)$;

the first maximum value at the temperature $T_H$ is defined as $G_{MAX1}(T_H)$; and X is an integer closest to $\{G_{MAX2}(T_L) / G_{MAX2}(T_p)\} \cdot \{G_{MAX1}(T_p) / G_{MAX1}(T_H)\} \cdot Y$.

* * * * *